United States Patent
Franke et al.

(10) Patent No.: US 10,165,686 B2
(45) Date of Patent: Dec. 25, 2018

(54) ELECTRICAL COMPONENT PACKAGE WITH SURFACE LEADS

(71) Applicant: Micronas GmbH, Freiburg (DE)

(72) Inventors: Joerg Franke, Freiburg (DE); Klaus Heberle, Emmendingen (DE); Oliver Breitwieser, Gundelfingen (DE); Timo Kaufmann, Waldkirch-Suggental (DE)

(73) Assignee: TDK-Micronas GmbH, Freiburg (DE)

( * ) Notice: Subject to any disclaimer, the term of this patent is extended or adjusted under 35 U.S.C. 154(b) by 176 days.

(21) Appl. No.: 14/812,718

(22) Filed: Jul. 29, 2015

(65) Prior Publication Data

US 2016/0037641 A1 Feb. 4, 2016

(30) Foreign Application Priority Data

Jul. 29, 2014 (DE) .................... 10 2014 010 977

(51) Int. Cl.
| | | |
|---|---|---|
| *H01L 33/48* | (2010.01) | |
| *H05K 1/18* | (2006.01) | |
| *G01R 33/00* | (2006.01) | |
| *G01R 1/04* | (2006.01) | |

(52) U.S. Cl.
CPC .............. *H05K 1/18* (2013.01); *G01R 33/00* (2013.01); *G01R 1/04* (2013.01); *H05K 2201/083* (2013.01)

(58) Field of Classification Search
CPC ....... H01L 33/48; H01L 33/483; H01L 33/50; H01L 33/52; H01L 33/65; H01L 33/56
See application file for complete search history.

(56) References Cited

U.S. PATENT DOCUMENTS

| | | | |
|---|---|---|---|
| 8,482,137 B2* | 7/2013 | Yoshioka | ................ H01L 24/24 257/618 |
| 2002/0022939 A1 | 2/2002 | Senta et al. | |
| 2004/0232435 A1 | 11/2004 | Hofer et al. | |
| 2009/0008642 A1* | 1/2009 | Kim | .................... H01L 27/3276 257/59 |
| 2009/0014822 A1 | 1/2009 | Poo et al. | |

(Continued)

FOREIGN PATENT DOCUMENTS

| | | |
|---|---|---|
| CN | 1757108 A | 4/2006 |
| CN | 101458726 A | 6/2009 |

(Continued)

OTHER PUBLICATIONS

Chinese Office Action dated Jul. 4, 2017 with English Translation.

*Primary Examiner* — Michael Lebentritt
*Assistant Examiner* — Suberr Chi
(74) *Attorney, Agent, or Firm* — Muncy, Geissler, Olds & Lowe, P.C.

(57) ABSTRACT

An electrical component having a first package part of a first plastic compound. The first package part has a first trench-shaped formation. A first semiconductor body with an integrated circuit is disposed in the first trench-shaped formation. At least two traces, which run on an outer side of the first package part, are provided on a surface of the first trench-shaped formation, wherein the at least two traces are connected to the integrated circuit. The first trench-shaped formation is filled at least partially with a filling material of a second plastic compound to cover the first semiconductor body.

19 Claims, 4 Drawing Sheets

(56) References Cited

U.S. PATENT DOCUMENTS

| | | |
|---|---|---|
| 2010/0185836 A1 | 7/2010 | Hasegawa |
| 2010/0283079 A1* | 11/2010 | Choi .................... H01L 33/486 |
| | | 257/98 |
| 2011/0180817 A1* | 7/2011 | Ishizaki .................. F21V 3/00 |
| | | 257/88 |

FOREIGN PATENT DOCUMENTS

| | | |
|---|---|---|
| CN | 101782894 A | 7/2010 |
| DE | 19626082 A1 | 1/1998 |
| DE | 102008007682 A1 | 12/2008 |
| EP | 2 688 094 A1 | 1/2014 |
| JP | 2006-294983 A | 10/2006 |
| JP | 2008-041817 A | 2/2008 |

\* cited by examiner

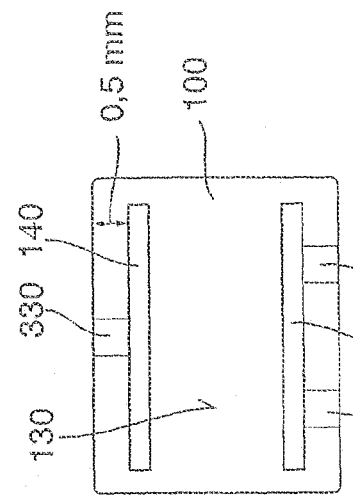
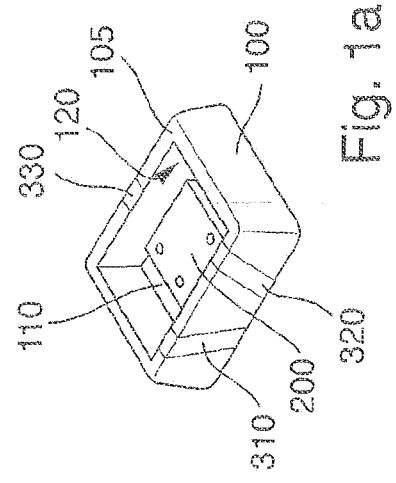
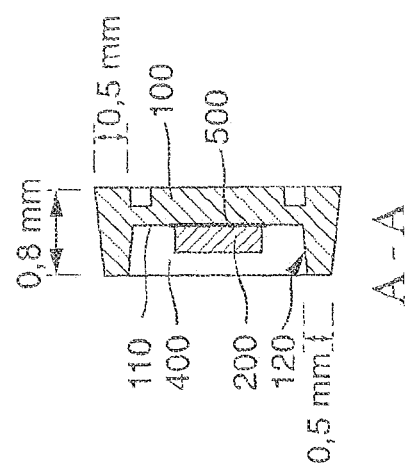
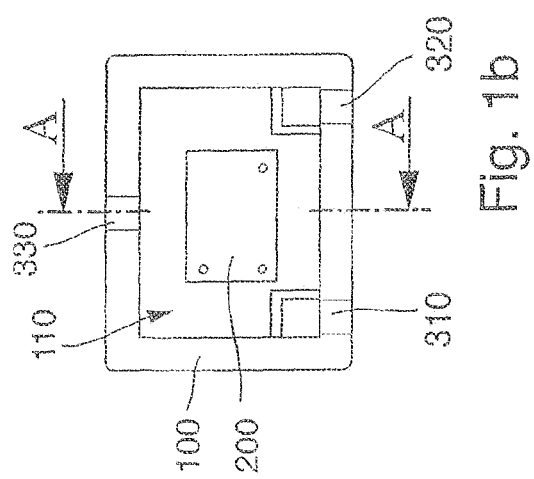

ELECTRICAL COMPONENT PACKAGE WITH SURFACE LEADS

This nonprovisional application claims priority under 35 U.S.C. § 119(a) to German Patent Application No. 10 2014 010 977.1, filed Jul. 29, 2014, all of which is herein incorporated by reference.

BACKGROUND OF THE INVENTION

Field of the Invention

The present invention relates to an electrical component.

Description of the Background Art

A quad flat no-leads package (QFN), also called a micro lead frame (MLF), is a chip package design customary in electronics for integrated circuits (IC). The term covers different sizes of IC packages all of which are soldered to printed circuit board as surface-mounted components.

The packages are commercially available under different, usually manufacturer-specific names. Typical names are, for example, DFN (dual flat no-lead package) or QFN (quad flat no-lead package).

Molded plastic components with metal traces deposited by special methods, which are used as interconnect devices for electronic or mechatronic components, are called molded interconnect devices, abbreviated as MID. Major fields of application for MID technology are automotive engineering, industrial automation, medical technology, the home appliance industry, telecommunications technology, measurement and analysis technology, and the aerospace industry. MIDs can be produced in very different ways. The most important methods for depositing traces and emitting or shielding surfaces are two-component injection molding, hot stamping, the mask exposure process, laser patterning, and in-mold decoration. A basic distinction is made between subtractive patterning and additive metallization methods.

SUMMARY OF THE INVENTION

It is therefore an object of the invention to improve an electrical component. Accordingly, an electrical component is provided.

In an embodiment, the electrical component has a first package part of a first plastic compound. The plastic compound comprises thermoplastic or thermosetting compounds and especially silicones and resins.

The first package part has a first trench-shaped formation.

A first semiconductor body with an integrated circuit is disposed in the first trench-shaped formation.

At least two traces are provided on a surface of the first trench-shaped formation. The at least two traces are run on an outer side of the first package part.

The at least two traces are connected to the integrated circuit.

The first trench-shaped formation is filled at least partially with a filling material of a second plastic compound to cover the first semiconductor body.

A universal, flexibly usable, leadframe-free package with a standardized footprint can be achieved by the previously explained features. The footprint can be standardized in accordance with the JEDEC Solid State Technology Association. The package can be produced more advantageously by forgoing the lead frame. Delamination on the semiconductor substrate is significantly reduced or can be totally prevented. Thus far contradictory requirements are optimized at the same time by a specific implementation, as illustrated in the embodiments in the figures. Good mechanical rigidity of the package is achieved. The traces are well anchored in the package part. The covering of the semiconductor body and optionally further components, such as passive elements, is optimized.

According to an embodiment, a fixing layer of a third plastic compound is introduced between the first semiconductor body and the first package part for material connection to the first semiconductor body and to the first package part.

According to an embodiment, the first package part can be produced as an injection-molded part. The at least two traces can be incorporated into the injection-molded part. Advantageously, the at least two traces are introduced via subtractive patterning MID methods and/or additive metallization MID methods. For example, the traces are introduced as metallic inserts.

According to an embodiment, a second semiconductor body with a further integrated circuit and/or a passive element can be disposed in the first trench-shaped formation. For example, capacitors and/or resistors can be passive components. Advantageously, the further integrated circuit and/or the passive element can be electrically connected to the integrated circuit. The passive element is, for example, a capacitor or a coil or a resistor.

According to an embodiment, the first package part can have a second trench-shaped formation. Advantageously, a permanent magnet and/or magnetically conductive material can be disposed in the second trench-shaped formation.

According to an embodiment, the first trench-shaped formation can be formed on the outer side of the first package part with the at least two traces.

According to an embodiment, the outer side of the first package part with the at least two traces can be opposite to a side of the first package part with the first trench-shaped formation.

According to an embodiment, the at least two traces can be disposed on the outer side of the first package part according to a standardized footprint (JEDEC).

In an embodiment, straight or u-shaped notches can be formed to mechanically decouple the traces from the traces on the outer side, facing the interconnect device.

In an embodiment, there can be at least two traces on the outer side of the housing lateral to the first trench-shaped formation.

The first package part can be made as a single piece and the first trench-shaped formation can be formed tub-shaped with a circumferential edge. This single piece formation significantly reduces manufacturing costs. The circumferential edge can have a thickness within a range from 0.1 mm to 1.0 mm, preferably 0.5 mm, whereby the first package part has a height of at least 0.8 mm. The edge of the trench can be higher than a thickness of the component located in the trench, in order to completely fill in the component and thus to protect it from environmental influences.

In an embodiment, there are precisely two notches running parallel to one another, whereby the notches are each formed away from an outer edge on a bottom side by a distance of the thickness of the circumferential edge, for example, by 0.5 mm. The notches are not formed up to the outer edge on the bottom side. This structure does not decrease the mechanical stability of the first package part.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 1a to 1d show views of an electrical component according to an exemplary embodiment;

DETAILED DESCRIPTION

Figure 2A:
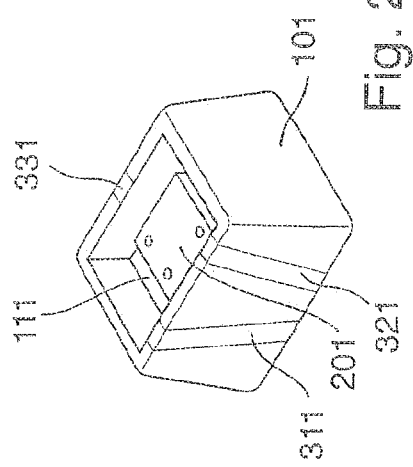
FIGS. 2a to 2d show views of an electrical component according to an exemplary embodiment.
Figure 2B:
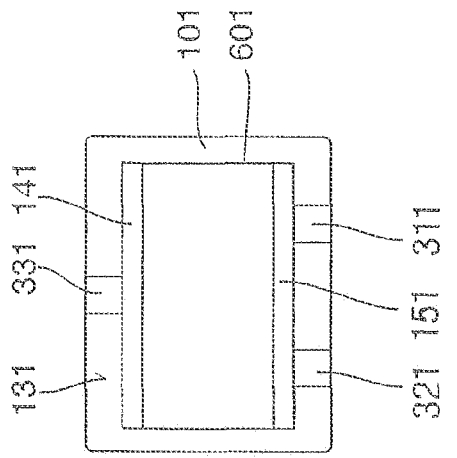
Figure 2C:
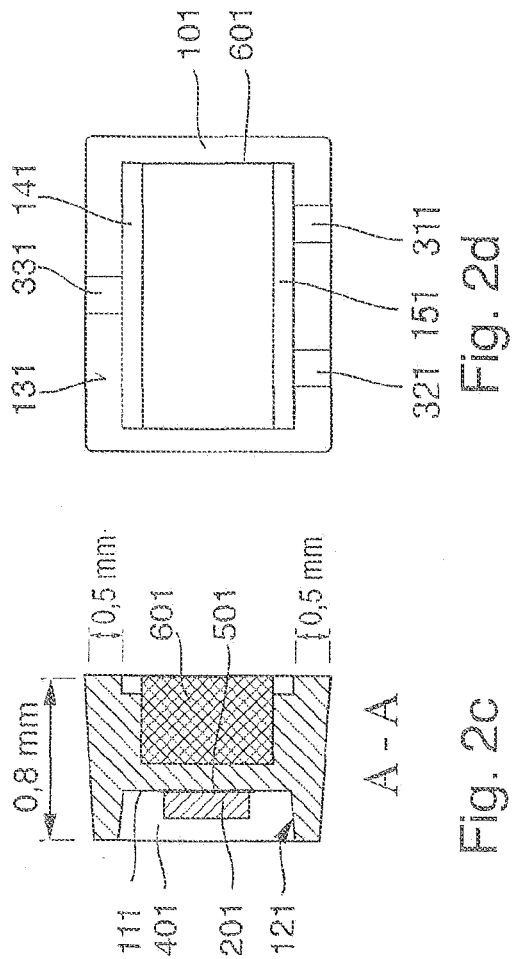
Figure 2D:
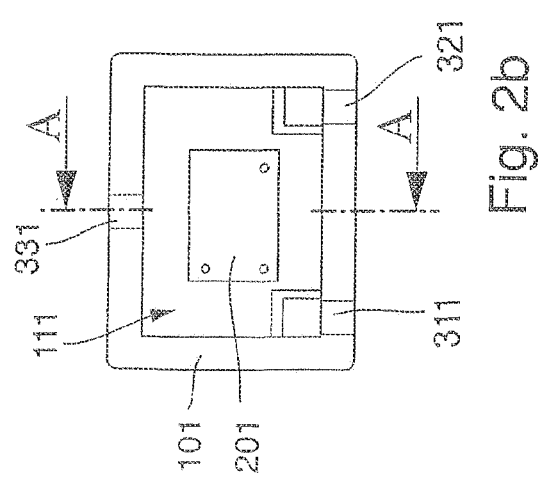

An electrical component is shown schematically in a three-dimensional view in FIG. 1a. FIG. 1b shows a schematic view of the top side of the electrical component, whereas FIG. 1d shows a schematic view of an outer side 130, forming bottom side 130. FIG. 1c shows a schematic sectional view along line A-A.

Three traces 310, 320, 330 are run on outer side 130 of a first package part 100. Traces 310, 320, 330 are disposed on outer side 130 for the electrical connection to the traces of an interconnect device, e.g., a circuit board. By running the traces around on the sides of the package part, moreover, the inspection of the correct wetting of the solder connection of the component with the circuit board after the soldering process is assured. In the embodiment in FIG. 1d, the traces are disposed in accordance with the standardized footprint SOT23. Depending on the number of traces, alternatively other standardized footprints, e.g., SOT323, QFN, etc., can be formed.

First package part 100 in FIGS. 1a to 1d can be made of a thermoplastic or thermosetting first plastic compound. The first plastic compound is based on, for example, acrylonitrile-butadiene-styrene (ABS), polyamides (PA), polylactate (PLA), poly(methyl methacrylate) (PMMA), polycarbonate (PC), polyethylene terephthalate (PET), polyethylene (PE), polypropylene (PP), polystyrene (PS), polyetheretherketone (PEEK), polyvinylchloride (PVC), celluloid, or polyolefins, such as polyethylene or polypropylene or epoxy resin. The material costs can be lowered, processing times shortened, and injection losses (hot runner injection molding) reduced by the use of the thermoplastic plastic compounds.

According to FIGS. 1a to 1c, first package part 100 has a first trench-shaped formation 110. The trench shape is preferably a rectangular outline with sloping trench walls. Alternatively, other trench shapes can also be provided such as, for example, oval or round trench shapes. The first package part 100 is made as a single piece and first trench-shaped formation 110 is formed tub-shaped with a circumferential edge. In this regard, the circumferential edge has a thickness of preferably 0.5 mm. First package part 100 has a height of at least 0.8 mm.

A first semiconductor body 200 with an integrated circuit is disposed in trench-shaped formation 110 in the embodiment in FIGS. 1a, 1b, and 1c. The integrated circuit has, for example, a number of transistors and/or diodes and/or other elements such as, e.g., sensor elements, which are connected together in the integrated circuit. Preferably, semiconductor body 200 is disposed on the base area of trench-shaped formation 110.

Three traces 310, 320, 330 are provided on a surface 120 of trench-shaped formation 110. Traces 310, 320, 330 are connected to the integrated circuit. The connection is made, for example, via bond wires or solder balls. Traces 310, 320, 330 create the connection of the integrated circuit to outer side 130 of the package. A bonding process and/or a "flip" process are carried out for this purpose. To this end, traces 310, 320, 330 are run on outer side 130 of first package part 100. Traces 310, 320, 330 are formed by an electrically conductive material. An electrically conductive material is, for example, a metal such as copper or aluminum or nickel or gold. Traces 310, 320, 330 can be run, for example, completely over surfaces 120, 130 of first package part 110. Traces 310, 320, 330 are produced, for example, by means of MID technology. Traces 310, 320, 330 are advantageously produced by means of a subtractive patterning method and/or an additive metallization method.

In the embodiment in FIG. 1c, trench-shaped formation 110 is filled at least partially with a filling material 400 to cover first semiconductor body 200. The filling material has a second plastic compound. Preferably, the second plastic compound also comprises silicones and/or resins. In this regard, the first plastic compound and the second plastic compound may have the same or a different material. By separating first package part 100 and filling material 400, the properties for covering semiconductor body 200 can be optimized separately from the first package part. For example, filling material 400 can be optimized with respect to delamination reduction. The mechanical stress acting on the semiconductor body is reduced by an optimized filling material 400. At the same time, first package part 100 can be optimized with respect to the required rigidity.

As shown in FIG. 1c, a fixing layer 500 of a third plastic compound for material connection to semiconductor body 200 and to first package part 100 is inserted between semiconductor body 200 and first package part 100. Preferably, the third plastic compound also comprises silicones and/or resins. Traces 310, 320, 330 are mechanically movable and mechanically decoupled from the rest of the package. A mechanical decoupling of traces 310, 320, 330 on outer side 130, facing the interconnect device, is achieved in the embodiment of FIGS. 1c and 1d by particularly straight or u-shaped notches 140, 150 on said outer side 130. The two notches 140, 150 run parallel to one another and are each away from the outer edge on bottom side 130 by a distance of preferably 0.5 mm. The two notches 140, 150 are also not formed up to the outer edge on bottom side 130.

Schematic views of an electrical component of a further embodiment are shown in FIGS. 2a to 2d. The electrical component has a first package part 101 with a first trench-shaped formation 111, a semiconductor body 201, and traces 311, 321, 331, whereby traces 311, 321, 331 are electrically connected to an integrated circuit of semiconductor body 201. Semiconductor body 201 is fixed by means of a fixing layer 501 on a surface 121 in trench-shaped formation 111 to first package part 101. Trench-shaped formation 111 is filled by means of a filling material 401.

In contrast to the embodiment in FIGS. 1a to 1d, in the embodiment in FIGS. 2a to 2d, a second trench-shaped formation is provided in first package part 100. A permanent magnet 601 is provided in the second trench-shaped formation in the embodiment in FIGS. 2c and 2d. Alternatively or in combination, a magnetically conductive material is disposed in the second trench-shaped formation. The embodiment in FIG. 2d has two notches 141, 151 on an outer side 131 of first package part 101 for the mechanical decoupling of traces 311, 321, 331 likewise from permanent magnet 601. Instead of permanent magnet 601, alternatively a passive element (not shown) such as, for example, a capacitor or a resistor, which is electrically connected to traces 311, 321, 331, can be disposed in the second trench-shaped formation.

In the embodiment in FIGS. 1a to 1d, outer side 130 of first package part 100 with three traces 310, 320, 330, forming footprint SOT23, is opposite to a side of first package part 100 with first trench-shaped formation 110. In contrast, in the embodiment of FIGS. 3a to 3e, trench-shaped formation 112 itself is formed on outer side 132 of first package part 102 with the at least two traces 312, 322, 332. To contact an interconnect device the electrical component according to FIG. 3a therefore is to be turned over (face down).

Figure 3A:
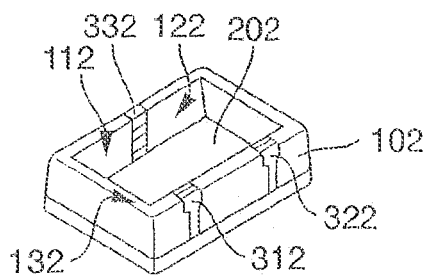
FIGS. 3a to 3e show views of an electrical component according to an exemplary embodiment.
Figure 3B:
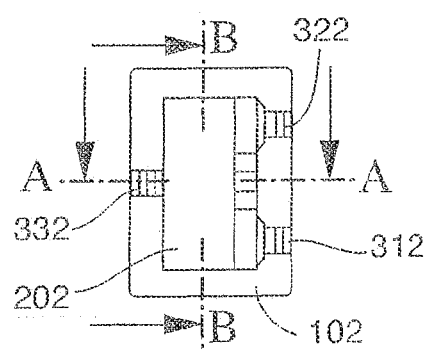
Figure 3C:
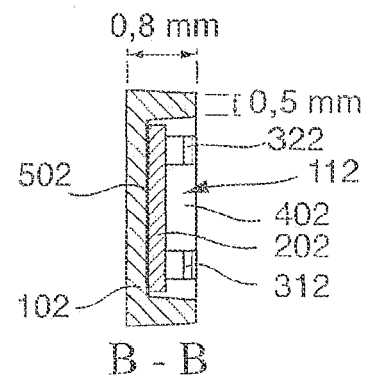
Figure 3E:
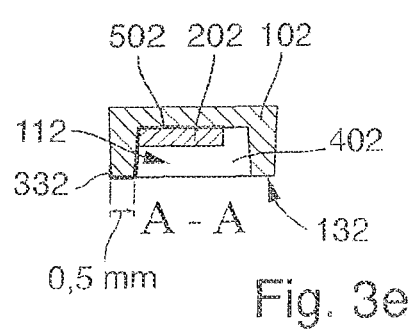
Figure 3D:
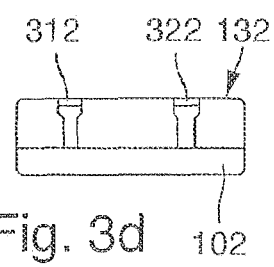
Figure 4A:
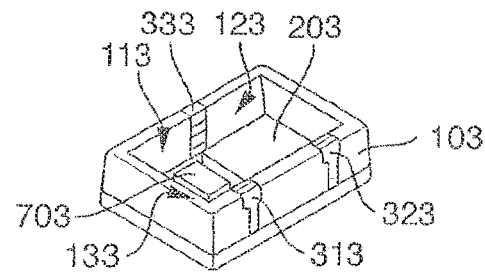
FIGS. 4a to 4e show views of an electrical component according to an exemplary embodiment.
Figure 4B:
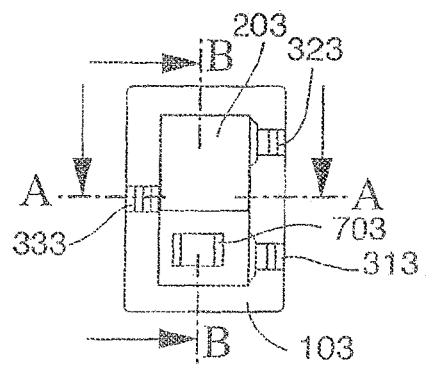
Figure 4C:
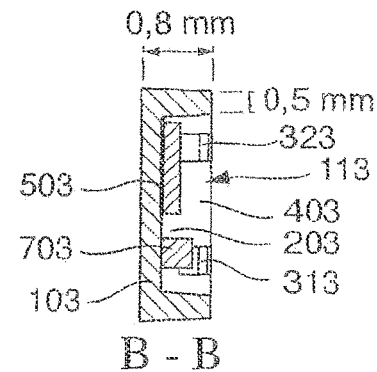
Figure 4E:
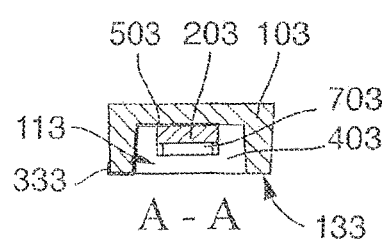
Figure 4D:
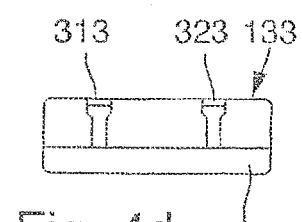

In FIG. 3a the electrical component is shown schematically in a three-dimensional view. FIG. 3b shows a schematic view of the top side of the electrical component, whereas FIG. 3d shows a schematic side view. FIG. 3c shows a schematic sectional view along line B-B. FIG. 3e shows a schematic sectional view along line A-A.

The electrical component has a first package part 102 with a trench-shaped formation 112, a semiconductor body 202, and traces 312, 322, 332, whereby traces 312, 322, 332 are electrically connected to an integrated circuit of semiconductor body 202. Semiconductor body 202 is fixed by means of a fixing layer 502 on a surface 122 in a first trench-shaped formation 112 to first package part 102. Trench-shaped formation 112 is filled by means of a filling material 402. Traces 312, 322, 332 are run on outer surface 132. The embodiment in FIGS. 3a to 3e enables a mechanical decoupling for reducing mechanical stress across the wall thickness of first package part 102 in the area of first trench-shaped formation 112.

A further embodiment of an electrical component is shown schematically in FIGS. 4a to 4e. In this case, semiconductor body 203 and at least one further element 703 are disposed in a first trench-shaped formation. The electrical component has a first package part 103 with a first trench-shaped formation 113, semiconductor body 203, and traces 313, 323, 333, whereby traces 313, 323, 333 are electrically connected to an integrated circuit of semiconductor body 203. Further element 703 is electrically connected to the integrated circuit of semiconductor body 203 and/or to traces 313, 323, 333. Semiconductor body 203 is fixed by means of a fixing layer 503 on a surface 123 in first trench-shaped formation 113 to first package part 103. Further element 703 can also be fixed by means of a fixing layer on surface 123 in first trench-shaped formation 113. First trench-shaped formation 113 is filled by means of a filling material 403. Traces 313, 323, 333 are run on outer surface 133.

Further element 703 is, for example, a further semiconductor body with a further integrated circuit. Both semiconductor bodies can be wired 2-dimensionally for contacting. The arrangement of further element 703 enables the integration of a plurality of similar (intelligent) semiconductor sensors with an effective axis lying one above the other. Preferably, further element 703 is a passive element such as, for example, a capacitor, a coil, or a resistor.

The invention is not limited to the shown embodiment variants of FIGS. 1a through 4e. Filling material 400, 401, 402, 403 is shown transparent in the figures. Preferably, filling material 400, 401, 402, 403 is opaque. It is also possible to make the shape of the first trench-shaped formation differently. It is also possible that a plurality of trench-shaped formations are provided on the same side of the first package part. The functionality of the electrical component according to FIG. 1a can be used especially advantageously for a magnetic field sensor.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An electrical component comprising:
   a first package composed of a first plastic compound, the first package being formed as a single piece, the single piece including a flat base and sloping side walls;
   a first trench-shaped formation formed in the first package between the sloping side walls;
   a first semiconductor body, with an integrated circuit, arranged in the first trench-shaped formation on the flat base of the first package;
   a second semiconductor body, with a plurality of semiconductors lying one above another along an effective axis of the second semiconductor body, arranged in the first trench-shaped formation on the flat base of the first package;
   at least two traces embedded in an outer surface of the sloping side walls of the first package and are provided on a surface of the flat base of the first trench-shaped formation, the at least two traces being connected to the integrated circuit; and
   a filling material of a second plastic compound filled in the first trench-shaped formation that covers at least the first semiconductor body, the outer surface having the at least two traces being opposite an inner surface of the first trench-shaped formation that contacts the filling material.

2. The electrical component according to claim 1, wherein a fixing layer of a third plastic compound is inserted between the first semiconductor body and the first package for material connection to the first semiconductor body and to the first package.

3. The electrical component according to claim 1, wherein the first package is injection-molded, and wherein the at least two traces are incorporated in the first package.

4. The electrical component according to claim 1, wherein the plurality of semiconductors are passive elements.

5. The electrical component according to claim 1, wherein the first package has a second trench-shaped formation, and wherein a permanent magnet and/or a magnetically conductive material are disposed in the second trench-shaped formation.

6. The electrical component according to claim 5, wherein the second trench-shaped formation is formed on the outer surface of the first package with the at least two traces.

7. The electrical component according to claim 5, wherein the second trench-shaped formation is made tub-shaped with a circumferential edge and the permanent magnet and/or the magnetically conductive material fills the second trench-shaped formation.

8. The electrical component according to claim 1, wherein the outer surface of the first package part having the at least two traces is opposite to a side of the first package with the first trench-shaped formation.

9. The electrical component according to claim 8, wherein the at least two traces are disposed on the outer surface of the first package according to a standardized footprint.

10. The electrical component according to claim 1, wherein a mechanical decoupling of the traces on the outer surface facing an interconnect device, is achieved by two straight or u-shaped notches formed around the traces.

11. The electrical component according to claim 10, wherein two notches run parallel to one another and the notches are formed away from an outer edge on a bottom side of the flat base by a distance within a range from 0.1 mm to 1.0 mm.

12. The electrical component according to claim 11, wherein the notches are not formed up to the outer edge on the bottom side.

13. The electrical component according to claim 1, wherein the at least two traces embedded in the outer surface of the sloping side walls are substantially perpendicular to the flat base of the first trench-shaped formation.

14. The electrical component according to claim 1, wherein the first trench-shaped formation is tub-shaped with a circumferential edge.

15. The electrical component according to claim 14, wherein the circumferential edge has a thickness within a range from 0.1 mm to 1.0 mm and the first package has a height of at least 0.8 mm.

16. The electrical component according to claim 1, wherein the at least two traces extend from the integrated circuit inside the first trench-shaped formation up an inside surface of the first package, extend over the sloping side walls, and extend at least partly down the outer surface of the first trench-shaped formation.

17. The electrical component according to claim 1, wherein the at least two traces extend from the integrated circuit inside the first trench-shaped formation and over two of the sloping side walls.

18. The electrical component according to claim 1, wherein only the sloped side walls and the at least two traces form a mounting surface of the electrical component, the mounting surface in contact with an interconnect device, the flat base being positioned over the first semiconductor body opposite the interconnect device.

19. An electrical component comprising:
a first package, composed of a first plastic compound, and including a base and sloping side walls;
a first trench-shaped formation formed in the first package between the sloping side walls;
a first semiconductor body, with an integrated circuit, arranged in the first trench-shaped formation on the base of the first package;
a second semiconductor body, having a plurality of semiconductors lying one above another, arranged in the first trench-shaped formation of the first package in a same horizontal plane as the first semiconductor body;
at least two traces embedded in an outer surface of the sloping side walls of the first package and provided on a surface of the flat base of the first trench-shaped formation, the at least two traces being connected to the integrated circuit.

* * * * *